United States Patent
Lee et al.

(10) Patent No.: US 8,609,503 B2
(45) Date of Patent: Dec. 17, 2013

(54) PHASE CHANGE MEMORY DEVICE AND FABRICATION METHOD THEREOF

(75) Inventors: Keum Bum Lee, Gyeonggi-do (KR); Su Jin Chae, Gyeonggi-do (KR); Hye Jin Seo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 46 days.

(21) Appl. No.: 13/357,882

(22) Filed: Jan. 25, 2012

(65) Prior Publication Data

US 2012/0156851 A1    Jun. 21, 2012

Related U.S. Application Data

(62) Division of application No. 12/648,389, filed on Dec. 29, 2009, now abandoned.

(30) Foreign Application Priority Data

Sep. 30, 2009    (KR) .................. 10-2009-0093603

(51) Int. Cl.
*H01L 21/8239*    (2006.01)

(52) U.S. Cl.
USPC ............ 438/382; 257/E21.004; 257/E21.645

(58) Field of Classification Search
USPC ............... 257/3, E47.001, E21.068, E21.645, 257/E21.004; 438/102, 382
See application file for complete search history.

(56) References Cited

U.S. PATENT DOCUMENTS

| | | | |
|---|---|---|---|
| 2007/0019479 A1* | 1/2007 | Kim et al. ................ | 365/189.05 |
| 2009/0166600 A1* | 7/2009 | Park et al. ........................ | 257/3 |

* cited by examiner

*Primary Examiner* — Whitney T Moore
(74) *Attorney, Agent, or Firm* — Ladas & Parry LLP

(57) ABSTRACT

The manufacturing of a phase change memory device that includes a switching device, a bottom electrode contact in contact with the switching device and a porous spacer formed on the bottom electrode contact. The formed bottom electrode contact exposes a switching device on a semiconductor substrate which the switching device is formed in, forming an insulating layer on a resultant structure of the semiconductor substrate including the bottom electrode contact by using an insulating compound having materials with different atomic sizes, and forming an insulating spacer within the bottom electrode contact hole by selectively etching the insulating layer.

28 Claims, 4 Drawing Sheets

PHASE CHANGE MEMORY DEVICE AND FABRICATION METHOD THEREOF

CROSS-REFERENCES TO RELATED APPLICATION

The present application claims priority under 35 U.S.C. 119(a) to Korean application number 10-2009-0093603, filed on Sep. 30, 2009, in the Korean Patent Office, which is incorporated by reference in its entirety as if set forth in full.

BACKGROUND

1. Technical Field

The inventive concept relates to a semiconductor memory device and, more particularly, to a phase change memory device and a method of manufacturing the same.

2. Related Art

A phase change material has a different status of an amorphous state or a crystalline state depending on a temperature. The phase change material has a lower resistance in a crystalline state than in an amorphous state and has a regular atomic arrangement. The phase change material may be a chalcogenide (GST)-based material which is a compound comprised of germanium (Ge), antimony (Sb) and tellurium (Te).

A phase change random access memory (PCRAM) is a memory device which stores and reads information by using a status change property of the change material and has a fast operation speed and a high integration. The phase change material of the PCRAM is phase-changed by the Joule's heat which is applied through a bottom electrode contact (BEC) serving as a heater.

In particular, in a reset operation of the PCRAM which phase-changes the phase change material in an amorphous state, an enormous amount of current should be applied for a short time and an amount of reset current affects a life span, a sensing margin and shrinkage of the device.

To heighten the height of the BEC or to reduce the contact area between the BEC and the phase change material, it is suggested to reduce the reset current. In particular, the method for forming a spacer on an inner side wall of the BEC to reduce the contact area between the BEC and the phase change material layer is an effective method to minimize the volume that the phase change material is phase-changed to the crystalline state or an amorphous state, thereby improving the operation speed and reducing the reset current.

FIGS. 1a and 1b are sectional views illustrating a method of manufacturing a conventional phase change memory device. First, as shown in FIG. 1a, a semiconductor substrate 101 having a diode 105 as a switching device formed in a predetermined portion of a first interlayer insulating layer 103, is prepared. A metal silicide layer 107 is formed on the diode 105. Next, a second interlayer insulating layer 109 is formed on the resultant structure of the semiconductor substrate 101 and the BEC hole 111 is formed in the second interlayer insulating layer 109 to expose the metal silicide layer 107.

Next, as shown in FIG. 1b, an insulating layer is formed on the resultant structure of the semiconductor substrate 101 including the BEC hole 111 and then etched back to form an insulating spacer 113 on a side wall of the BEC hole 111.

The insulating spacer 113 is typically formed of a nitride material. In a spacer etching process, the insulating spacer 113 formed of a nitride material is etched faster in an upper potion of the BEC hole 111 than in the bottom portion of the BEC hole 111. Therefore, the diameter of the upper portion of the BEC hole 111 may be different from that of the bottom portion of the BEC hole 111 due to the insulating spacer 113. Although the insulating spacer 113 is formed to reduce the contact area between the BEC and the phase change material layer, since the upper portion 115 of the insulating spacer 113 is over etched due to the etch rate difference, the diameter in the upper portion of the BEC hole can not be reduced and therefore it can not obtain the desired objective to reduce the reset current.

Meanwhile, the BEC serving as a heater should fast radiate the heat applied in the reset operation.

FIG. 2 is a diagram explaining the heat radiation efficiency of the phase change memory device. Referring to FIG. 2, the phase change material layer 205 is phase-changed by the heating of the BEC 203 and then the applied heat is radiated through the phase change material layer 205 (A) or through the bottom (B) or the side (C) of the BEC 203. The reference numeral 201 designates an interlayer insulating layer.

The heat radiating through the phase change material layer 205 is 3 to 18% of the heat applied to the BEC 205 and the heat radiating through the bottom of the BEC 203 is 60 to 72% of the applied heat. The heat radiating through the side wall of the BEC 203 is 21 to 25% of the applied heat. Accordingly, if the insulating spacer is formed in the BEC hole, approximately one-fourth of the heat applied to the BEC 203 should be radiated to the insulating spacer. However, the nitride material of the insulating spacer is inefficient to radiate the heat because of the nature of the material. Furthermore, as the thickness of the insulating spacer is increased to reduce the diameter of the BEC, the speed of the heat radiation becomes further delayed such that the operation speed of the device is lowered.

SUMMARY

An embodiment of the inventive concept provides a phase change memory device having a bottom electrode contact of excellent heat radiation efficiency and a method of manufacturing the same.

Another embodiment of the inventive concept provides a phase change memory device being capable of refrigerating a phase change material layer with high speed and a method of manufacturing the same.

According to one aspect of an exemplary embodiment, a phase change memory device includes a switching device, a bottom electrode contact in contact with the switching device and a porous spacer formed on an outer wall of the bottom electrode contact.

According to another aspect of another exemplary embodiment, a method of manufacturing a phase change memory device includes forming a bottom electrode contact hole to expose a switching device on a semiconductor substrate which the switching device is formed in, forming an insulating layer on a resultant structure of the semiconductor substrate 201 including the bottom electrode contact hole by using an insulating compound having materials with different atomic sizes, and forming an insulating spacer within the bottom electrode contact hole by selectively etching the insulating layer.

According to still another aspect of another exemplary embodiment, a method of manufacturing a phase change memory device includes forming a switching device on the semiconductor substrate, forming a bottom electrode contact hole to expose an upper surface of the switching device, and forming a porous spacer on an inner wall of the bottom electrode contact hole.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1A:
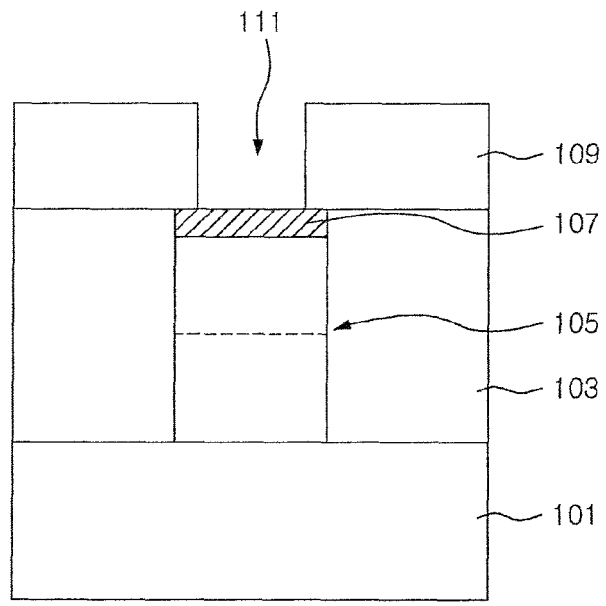
FIGS. 1a and 1b are sectional views illustrating a method of manufacturing a conventional phase change memory device.
Figure 1B:
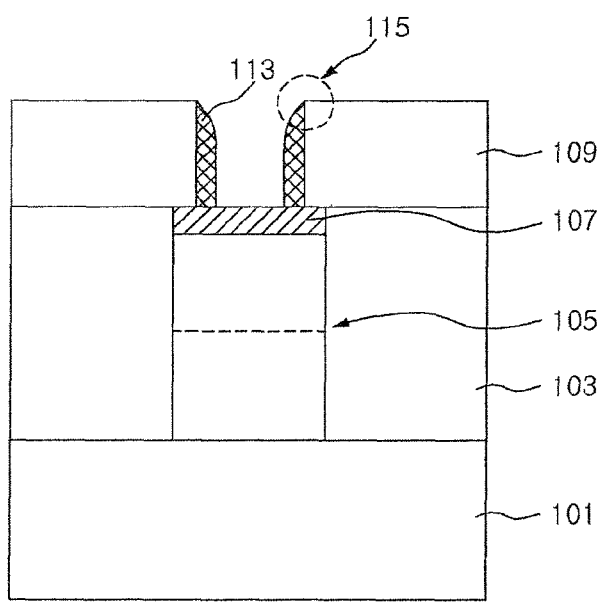
Figure 2:
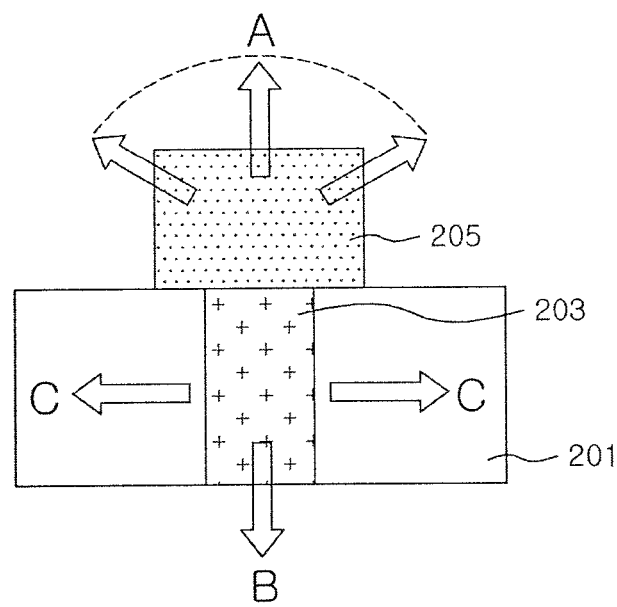
FIG. 2 is a diagram explaining an efficiency of a heat radiation in the conventional phase change memory device.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

Figure 3:
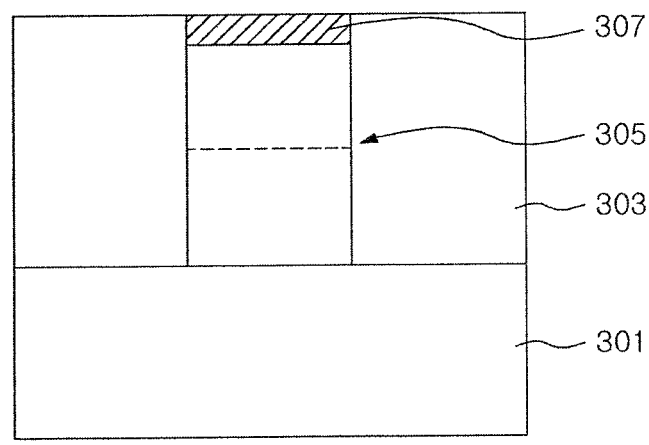
FIGS. 3 through 7 are sectional views illustrating a method of manufacturing a phase change memory device according to an exemplary embodiment.

FIGS. 3 through 7 are sectional views illustrating a method of manufacturing a phase change memory device according to an exemplary embodiment. Referring to FIG. 3, a semiconductor substrate 301 which a switching device 305 is formed on, is prepared. The switching device 305, for example, may be formed by forming a first interlayer insulating layer 303 on the semiconductor substrate 301 which a junction region (not shown) is formed in, patterning the first interlayer insulating layer 303 to expose the junction region, growing a selective epitaxial growth layer, and carrying out an ion implanting process to the selective epitaxial growth layer.

In addition, a metal silicide layer 307 is formed on the switching device 305. The metal silicide layer 307 may be formed by a metal layer, for example a cobalt (Co)/titanium (Ti)/Titanium nitride (TiN) (Co/Ti/TiN) layer, on a resultant structure of the semiconductor substrate 301 including the switching device 305, carrying out a first annealing process, removing an inactive portion of the metal layer, and carrying out a second annealing process, for example.

Although a diode is used as the switching device 305 in FIG. 3, it is not limited thereto and any semiconductor device working as the switching device may be used. Furthermore, the metal silicide layer 307 may be selectively formed as necessary.

Figure 4:
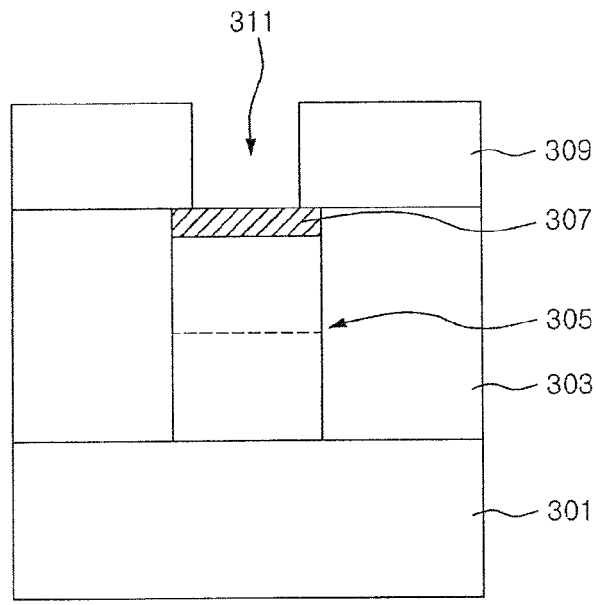

Referring to FIG. 4, following forming the switching device 305 and the metal silicide layer 307, a second interlayer insulating layer 309 is formed on a resultant structure of the semiconductor substrate 301. Moreover, a bottom electrode contact hole 311 having a desired diameter is formed to expose the metal silicide layer 307 in the second interlayer insulating layer 309.

The bottom electrode contact hole 311 may be formed to have a diameter larger than the desired diameter by 30 to 40 nm under the consideration of a thickness of a spacer to be formed in the subsequent process, for example. Accordingly, the process margin for the bottom electrode contact hole 311 can be sufficiently ensured and the etch efficiency can be also increased.

Figure 5:
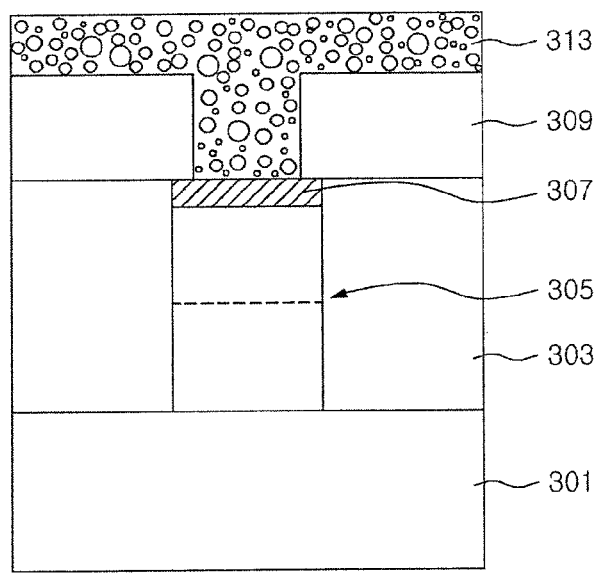

Next, referring to FIG. 5, a porous insulating layer 313 is formed on a resultant structure of the semiconductor substrate 301 including the bottom electrode contact hole 311. The porous insulating layer 313 may be formed at the same thickness as an increment of a diameter (30 to 40 nm) by using a porous insulating material, for example. The porous insulating material may comprise an insulating compound having materials with different atomic sizes, for example. The porous insulating material may comprise a compound containing a germanium having a large atomic size, preferably silicon germanium (SiGe) or silicon germanium nitride (SiGeN), for example.

The porous insulating layer 313 may be formed, for example, by an atomic layer deposition (ALD) method or a chemical vapor deposition (CVD) method. During the ALD method, porous insulating layer 313 is formed by repeatedly depositing each material having a different atomic size at least one or more times in a pre-arranged order. For example, when the porous insulating material is SiGe, each material having a different atomic size is repeatedly deposited at least one or more times in a pre-arranged order to form the porous insulating layer 313. Or, the Ge-rich porous insulating layer 313 is formed by increasing the deposition number of the germanium layer having a larger atomic size than that of the silicon layer, such that the efficiency of the heat radiation can be further increased. Meanwhile, the Si-rich porous insulating layer 313 is formed by increasing the deposition number of the silicon having a higher thermal conductivity than that of the germanium layer, such that the efficiency of the heat radiation can be also increased.

When the porous insulating material is SiGeN, each material having a different atomic size may be repeatedly deposited at least one or more times in a pre-arranged order to form the porous insulating layer 313. In addition, the Ge-rich porous insulating layer 313 or the Si-rich porous insulating layer 313 may be also formed. Furthermore, if the purge time of a purge process carried out following the deposition of the nitride layer is controlled, for example, to be two to three times longer than the purge time of a purge process carried out following the deposition of the Si layer or the Ge layer, the porous insulating layer 313 having further excellent efficiency of the heat radiation may be formed.

When the porous insulating layer 313 is formed by using SiGeN through an ALD method, the Si layer/the germanium layer (Or the silicon germanium layer)/the nitride layer may be sequentially deposited or the silicon layer/the nitride layer/the germanium layer may be sequentially deposited, for example.

In the exemplary embodiment, when the porous insulating layer 313 is to be formed by an ALD method, source gas may be injected by a shower head method or an injection method, for example. The deposition temperature may be at 300 to 500° C. and $GeH_4$ may be used as a Ge source gas and any one of DCS, $SiH_4$, or $S_2H_6$ may be used as a Si source gas, for example.

Figure 6:
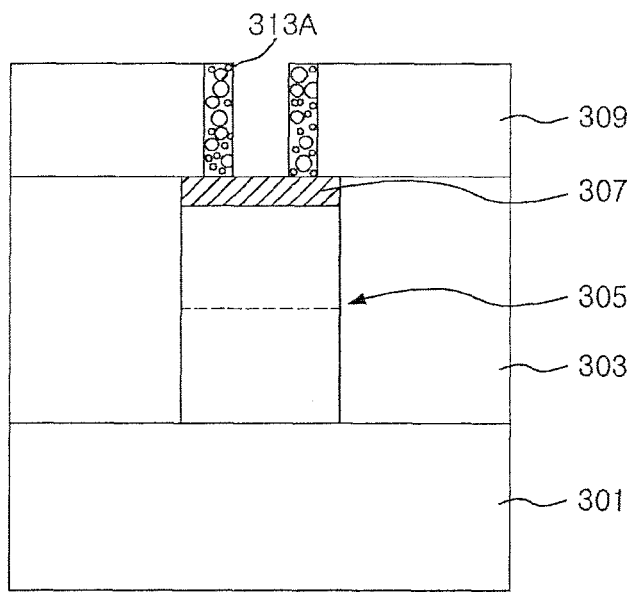

Referring to FIG. 6, a porous spacer 313A may be formed on an inner wall of the bottom electrode contact hole through a spacer etching process. The porous insulating material has the etching rate in an upper portion of the bottom electrode contact hole almost equal to that in a lower portion of the bottom electrode contact hole such that it can control the diameter of the upper portion of the bottom electrode contact hole to be almost equal to that of the lower portion of the bottom electrode contact hole. Accordingly, a contact area between a bottom electrode contact and a phase change material layer can be effectively reduced, thereby minimizing a reset current.

Figure 7:
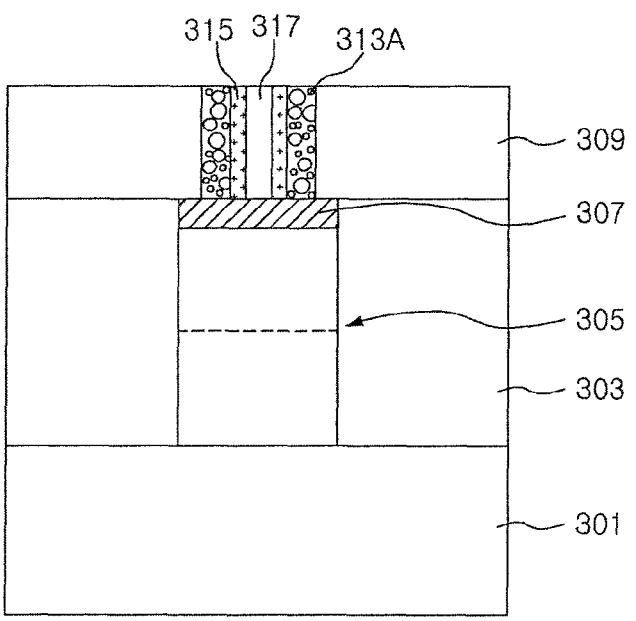

Next, referring to FIG. 7, the bottom electrode contact 315 is formed. The ring type bottom electrode contact 315 is illustrated in FIG. 7 in which an insulating material 317 is filled within the bottom electrode contact 315. The shape of the bottom electrode contact 315 is not limited thereto and the bottom electrode contact may be embodied in a various shape such as a pillar type or a cylinder type, for example.

Although not shown in drawings, after the bottom electrode contact is formed for example, the phase change material layer may be formed to be contacted with the bottom electrode contact and then an upper electrode may be formed.

The heat applied to the bottom electrode contact 315, which is a heater, by a reset operation such that the phase change material layer is phase-changed into an amorphous state, is radiated to the phase change material layer or to the side and bottom of the bottom electrode contact 315. In particular, this inventive concept forms the porous spacer 313A on the outer wall of the bottom electrode contact such that the heat radiation speed can be improved and therefore the operation speed of the device can be improved.

Accordingly, the heat applied in the reset operation of the phase change memory device can be radiated with a high speed such that the reset current can be reduced and the total power consumption can be lowered. Substantially, when the porous spacer is formed, the aspect ratio of the bottom electrode contact, for example, can be 1:3 in a design rule of 40 nm or below and the amount of the reset current can be lowered below 0.2 to 0.25 mA, for example. The bottom electrode contact of a various shape, such as a pillar type or a ring type for example, can be formed due to excellent step coverage of the porous insulating material.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of manufacturing a phase change memory device, comprising the steps of:
    forming a bottom electrode contact hole to expose a switching device on a semiconductor substrate;
    forming an insulating layer on a resultant structure of the semiconductor substrate including the bottom electrode contact hole by using an insulating compound having materials of different atomic sizes; and
    forming an insulating spacer within the bottom electrode contact hole by selectively etching the insulating layer,
    wherein the step of forming the insulating layer comprises repeatedly depositing a plurality of insulating materials having different atomic sizes at least one or more times in a pre-arranged order.

2. The method of claim 1, wherein the insulating compound comprises a germanium compound.

3. The method of claim 2, wherein the germanium compound comprises silicon-germanium.

4. The method of claim 3, wherein the step of forming an insulating layer comprises repeatedly depositing a silicon layer and a germanium layer at least one or more times in a pre-arranged order.

5. The method of claim 3, wherein the insulating layer is a Ge-rich insulating layer.

6. The method of claim 3, wherein the insulating layer is a Si-rich insulating layer.

7. The method of claim 2, wherein the germanium compound comprises silicon-germanium-nitride.

8. The method of claim 7, wherein the step of forming an insulating layer comprises repeatedly depositing each of a silicon layer, a germanium layer and a nitride layer at least one or more time in a pre-arranged order.

9. The method of claim 8, wherein after forming the silicon layer, the germanium layer and the nitride layer, further carrying out purge processes, respectively,
    wherein a purge time of a purge process carried out after forming the nitride layer is two to three times longer than a purge time of a purge process carried out after forming the silicon layer and the germanium layer.

10. The method of claim 7, wherein the insulating layer comprises a Ge-rich insulating layer.

11. The method of claim 7, wherein the insulating layer comprises a Si-rich insulating layer.

12. The method of claim 7, wherein the step of forming an insulating layer comprises forming a Ge-rich insulating layer by sequentially depositing a silicon layer, a germanium layer and a nitride layer at least one or more times.

13. The method of claim 7, wherein the step of forming an insulating layer comprises forming a Si-rich insulating layer by sequentially depositing a silicon layer, a germanium layer and a nitride layer at least one or more times.

14. The method of claim 7, wherein the step of forming an insulating layer comprises forming a Ge-rich insulating layer by sequentially depositing a silicon layer, a nitride layer and a germanium layer at least one or more times.

15. The method of claim 7, wherein the step of forming an insulating layer comprises forming a Si-rich insulating layer by sequentially depositing a silicon layer, a nitride layer and a germanium layer at least one or more times.

16. The method of claim 1, wherein the step of forming an insulating layer comprises depositing a plurality of insulating materials having different atomic sizes by using a chemical vapor deposition method.

17. A method of manufacturing a phase change memory device, comprising the steps of:
    forming a switching device on a semiconductor substrate;
    forming a bottom electrode contact hole to an upper portion of the switching device; and
    forming a porous spacer on a portion of the bottom electrode contact hole,
    wherein the step of forming the porous spacer comprises forming the porous insulating layer on a resultant structure of the semiconductor substrate comprises the bottom electrode contact hole, and
    wherein the forming the porous spacer comprises repeatedly depositing a plurality of insulating materials having different atomic sizes at least one or more times in a pre-arranged order.

18. The method of claim 17, wherein the step of forming the porous spacer further comprises;
    space-etching the porous insulating layer.

19. The method of claim 18, wherein the porous insulating layer is formed by using a germanium compound.

20. The method of claim 19, wherein the germanium compound comprises silicon-germanium.

21. The method of claim 20, wherein the step of forming a porous insulating layer comprises sequentially depositing a silicon layer and a germanium layer at least one or more times.

22. The method of claim 21, wherein the porous insulating layer comprises a Ge-rich insulating layer.

23. The method of claim 21, wherein the insulating porous layer comprises a Si-rich insulating layer.

24. The method of claim 19, wherein the germanium compound comprises silicon-germanium-nitride.

25. The method of claim 24, wherein the porous insulating layer comprises a Ge-rich insulating layer.

26. The method of claim 24, wherein the insulating layer comprises a Si-rich insulating layer.

27. The method of claim 24, wherein after forming the silicon layer, the germanium layer and the nitride layer, further comprising carrying out purge processes respectively,
wherein a purge time of a purge process carried out after forming the nitride layer is two to three times longer than a purge time of a purge process carried out after the silicon layer and the germanium layer.

28. The method of claim 17, wherein the step of forming the porous insulating layer comprises depositing the plurality of insulating materials having the different atomic sizes by a chemical vapor deposition method.

\* \* \* \* \*